(12) United States Patent
Royak et al.

(10) Patent No.: US 8,330,405 B2
(45) Date of Patent: Dec. 11, 2012

(54) METHOD AND APPARATUS FOR INCREASED CURRENT STABILITY IN A PWM DRIVE

(75) Inventors: Semyon Royak, Beachwood, OH (US); Mark M. Harbaugh, Richfield, OH (US); Thomas A. Nondahl, Wauwatosa, WI (US); Jingbo Liu, Grafton, WI (US); Peter B. Schmidt, Franklin, WI (US); Robert J. Breitzmann, South Russel, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 694 days.

(21) Appl. No.: 12/487,012

(22) Filed: Jun. 18, 2009

(65) Prior Publication Data

US 2010/0320948 A1 Dec. 23, 2010

(51) Int. Cl.
*H03K 5/00* (2006.01)
(52) U.S. Cl. ............... 318/400.13; 318/400.01; 318/700
(58) Field of Classification Search ............. 318/400.01, 318/400.13, 700
See application file for complete search history.

(56) References Cited

U.S. PATENT DOCUMENTS

| | | | | |
|---|---|---|---|---|
| 5,457,375 | A | * | 10/1995 | Marcinkiewicz et al. .... 318/802 |
| 5,729,102 | A | * | 3/1998 | Gotou et al. ............. 318/400.13 |
| 6,426,602 | B1 | * | 7/2002 | McCann et al. ............. 318/432 |
| 6,639,379 | B2 | * | 10/2003 | Matsushita et al. ........... 318/727 |
| 6,677,724 | B1 | * | 1/2004 | Kim et al. ..................... 318/700 |
| 6,972,534 | B1 | | 12/2005 | Schulz et al. |
| 7,064,504 | B2 | * | 6/2006 | Imai et al. ................. 318/400.04 |
| 2002/0113569 | A1 | * | 8/2002 | Iijima et al. .................... 318/727 |
| 2002/0113615 | A1 | * | 8/2002 | Atarashi ........................ 324/772 |
| 2009/0251096 | A1 | * | 10/2009 | Schulz et al. ................. 318/801 |

FOREIGN PATENT DOCUMENTS

JP 2001169578 * 6/2001

OTHER PUBLICATIONS

Schulz et al., "Implementation of Variable-Delay Random PWM for Automotive Applications," IEEE Trans. on Vehicular Tech., May 2007, pp. 1427-1433, vol. 56, No. 3.

* cited by examiner

*Primary Examiner* — Kawing Chan
(74) *Attorney, Agent, or Firm* — Boyle Fredrickson, S.C.; Alexander R. Kuszewski; John M. Miller

(57) ABSTRACT

The present invention provides an improved current regulator for PWM based drives for electric motors. The invention provides compensation for the rotor position signal for delays introduced due to the PWM algorithm and for digital sampling present in such a drive. Current regulator commonly operate in a two-phase reference frame, requiring forward and reverse coordinate transformations between the physical current values and the two-phase reference frame variables. The present invention provides an improved compensation in the forward transformation by determining the phase lag between the commanded voltage reference and the output voltage reference and by further compensating the forward transformation for errors introduced due to sampling the current either at different sampling instances than the rotor position or at multiple sampling instances during a carrier period. Additionally, compensation during the reverse transformation is provided to compensate for errors introduced due to sampling the current and rotor position.

20 Claims, 4 Drawing Sheets

$$\gamma_v = \frac{2 \cdot \pi \cdot f_{fn}}{f_c} \cdot \frac{K}{M} + \left[ \frac{\pi}{N_2} + \left( \frac{\pi}{N_1} - \frac{\pi}{N_2} \right) \cdot \left( N_2 - \frac{f_c}{f_{fn}} \right) \right]$$

FIG. 5

$$\gamma_c = \frac{2 \cdot \pi \cdot f_{fn}}{f_c} \cdot \left[ 1 - \frac{X}{G \cdot M} - \frac{K}{M} \right]$$

FIG. 6

METHOD AND APPARATUS FOR INCREASED CURRENT STABILITY IN A PWM DRIVE

BACKGROUND OF THE INVENTION

The subject matter disclosed herein relates to power converters for electric motors. More specifically, the subject matter relates to a current regulator which compensates the rotor position signal for delays introduced due to pulse width modulation and digital sampling in a motor drive.

As is known to those skilled in the art, electric motors require power converters, commonly called motor drives, to regulate the amplitude and frequency of the electrical voltage applied to the motor in order to achieve variable speed control of the motor. Motor drives commonly utilize Pulse Width Modulation (PWM) algorithms to vary the amplitude and frequency of the electrical voltage. These PWM algorithms operate to continuously switch a voltage, commonly a DC voltage, on and off. If analyzed over a short period of time, the switched output voltage results in an average voltage value applied to the motor. The motor drive uses a current regulator to generate a desired voltage reference during a first carrier period. The carrier period is the time interval (the inverse of which is known as the carrier frequency) during which the PWM voltage switches on and off to provide the desired average voltage value for that time interval. The desired voltage reference is updated and remains the same during each carrier period, resulting in a stair-step waveform of voltage references output by the motor drive. If the carrier frequency is large enough with respect to the desired electrical output frequency to the motor, each step of the output waveform will be small and the output voltage begins to approximate a sinusoidal waveform. Under these operating conditions, the motor drive typically provides an output voltage suitable for controlling the motor.

However, PWM switching is not without drawbacks. As the carrier frequency and the desired electrical output frequency to the motor grow closer, each step of the output voltage waveform grows longer diverging from the desired sinusoidal output voltage reference and increasingly appearing to be a stepped voltage output to the motor. The stepped output voltage may produce undesirable operation, including instability of the current regulator resulting in a loss of control of the motor.

In addition to the potential instability in the current regulator, the digital nature of the motor drive may present further challenges for providing high performance motor control. The motor drive samples continuous time signals, such as the current in the motor and rotor position, at discrete time intervals. The current regulator uses these discrete values to calculate a voltage reference. Sampling and execution of the current regulator are performed during a first carrier period of the PWM algorithm. The voltage reference is then output to the motor during the following carrier period. Consequently, the output voltage, in addition to being a stepped waveform, is inherently delayed from the sampled signals by one carrier period. The resulting voltage waveform output to the motor, therefore, includes a phase lag that is dependent on several factors, including the carrier frequency, the output frequency, and the sampling of the continuous time signals.

Previous attempts to compensate the current regulator have focused on the dependency of the phase lag on the carrier frequency. Typically, a time delay equal to one half of the carrier period has been introduced into the voltage reference calculation. Such a delay results in the current regulator providing a voltage reference for the middle of the next carrier period as this is the period during which the reference is being applied to the motor. While such compensation yields some improved performance, it fails to consider the dependency of the phase lag on the desired output frequency and on the timing of sampling the continuous time signals. As the ratio of the carrier frequency of the PWM algorithm to the desired output frequency becomes smaller, the ability to accurately determine the phase lag between the output voltage reference and commanded voltage reference becomes more important. Therefore, it would be desirable to have a motor drive that provides an improved angle compensation for the current regulator in order to improve stability of the current regulator as the ratio of the carrier frequency of the PWM algorithm to the desired output frequency to the motor decreases.

BRIEF DESCRIPTION OF THE INVENTION

The present invention provides an improved current regulator for PWM based drives for electric motors. The invention provides compensation for the rotor position signal for delays introduced due to the PWM algorithm and for digital sampling present in such a drive. Current regulators commonly operate in a two-phase reference frame and, preferably, the synchronous reference frame. Operating in the synchronous reference frame requires forward and reverse coordinate transformations between the measured current values in a stationary frame and the synchronous reference frame variables. The rotor position information is one of the variables used to perform this transformation. The present invention provides an improved compensation in the forward transformation, from a synchronous to a stationary reference frame, by accurately determining the phase lag between the commanded voltage reference and the output voltage reference and by further compensating the forward transformation for errors introduced due to sampling the current either at different sampling instances than the rotor position or at multiple sampling instances during a carrier period. Additionally, compensation during the reverse transformation, from the stationary to a synchronous reference frame, is provided to compensate for errors introduced due to the timing of sampling the current and rotor position signals.

In one embodiment of the present invention, a method of regulating current for an electric motor having a rotor and a stator using a pulse width modulation (PWM) based controller is disclosed. At least one phase current drawn by the stator of the motor is measured and an angular position of the rotor in the motor is determined. A voltage compensation angle is added to the angular position. The voltage compensation angle is determined by the phase lag between a sinusoidal voltage reference and the first harmonic of a discrete voltage reference output resulting from the sinusoidal voltage reference.

Thus, it is a feature of this invention to provide an improved compensation for the angular position of a rotor in a motor drive. Determining the phase lag between the first harmonic of the discrete voltage reference output and the sinusoidal voltage reference provides dynamic angle compensation based on the commanded output voltage.

As another aspect of this invention, the voltage reference signal in a two-phase reference system is determined using the phase current and the angular position. The method performs a reference frame transformation on the voltage reference signal using the compensated angular position.

Thus it is another feature of this invention that the compensated rotor position is used by the current regulator to improve stability of the current regulator.

As still another aspect of the invention, the voltage compensation angle is calculated by first finding a ratio of the carrier frequency to the fundamental frequency of the motor. A first integer value less than the ratio and a second integer value greater than the ratio are identified and the value for the voltage compensation angle is interpolated between pi divided by the first integer value and pi divided by the second integer value, causing the voltage compensation angle to be a function of the ratio of the carrier frequency to the fundamental frequency. As yet another aspect of the invention, the voltage compensation angle further adds an offset angle, which is a function of the number of times the current is sampled during each PWM period.

Thus, it is another feature of the invention that an expression for determining the phase lag between the first harmonic of the discrete voltage reference output and the sinusoidal voltage reference is provided which may be evaluated during a single carrier period.

As yet another aspect of the invention, the method includes a step of calculating a current angle offset. The current angle offset is a function of the number of times, and of the position in time, during each PWM period that the phase current and the angular position are sampled. The current angle offset is calculated after determining an angular position of the rotor and before determining a voltage reference signal. The voltage reference signal is determined using the phase currents and the current angle offset added to the motor position.

Thus, it is another feature of this invention that the stability of the current regulator is enhanced by compensating the rotor position angle as a function of when the current is sampled during each carrier period prior to performing the current transformation.

It is another aspect of the invention, that the angular position of the motor may be determined using a position transducer. Alternately, the angular position of the motor may be determined using a position observer.

Thus, it is still another feature of this invention that the enhanced current regulator may be used either with a position sensor or on a sensorless motor drive.

As another aspect of the present invention, the method regulates current for a PWM controller when the carrier frequency is selected to be 20 times greater than the fundamental electrical frequency of the motor.

Thus, it is another feature of this invention that the angle compensation in the current regulator provides increased stability of the control system, such that the drive may operate with a carrier frequency of the PWM algorithm close to the fundamental electrical frequency of the motor.

In another embodiment of the invention, a PWM-based motor control system operating at a carrier frequency is disclosed. The control system includes a power conversion section to convert an input voltage to an output voltage for the motor and at least one current sensor providing a current signal corresponding to a current output to the motor. A position sensing means providing a position signal corresponding to an angular position of the rotor of the motor is also included. The control system further includes a processor receiving each of the current and position signals and executing a stored program. In the program, the current feedback signal is read at least once during each carrier period, each reading occurs at one of the at least one sampling intervals occurring during each carrier period. The program reads the position signal and calculates a current angle offset which is a function of the number of times and of the position in time during each carrier period that the phase current and the angular position are sampled. A voltage reference signal in a two-phase reference system is determined using the phase current and the current angle offset added to the angular position. The program further compensates the position signal by adding a voltage compensation angle to the position signal. The voltage compensation angle adds a phase lag between a sinusoidal voltage reference and the first harmonic of a discrete voltage reference output resulting from the sinusoidal voltage reference to an offset angle which is a function of the number of times the current is sampled during each carrier period. The program performs a reference frame transformation on the voltage reference signal using the compensated angular position. The motor control system provides the transformed voltage reference signal to the power conversion section as the reference for the output voltage.

Thus it is another feature of the invention that the current regulator with enhanced stability is incorporated into a motor control system.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which:

FIG. 5 is a graphical representation of one embodiment of the first compensation block; and FIG. 6 is a graphical representation of one embodiment of the second compensation block.

Figure 1:
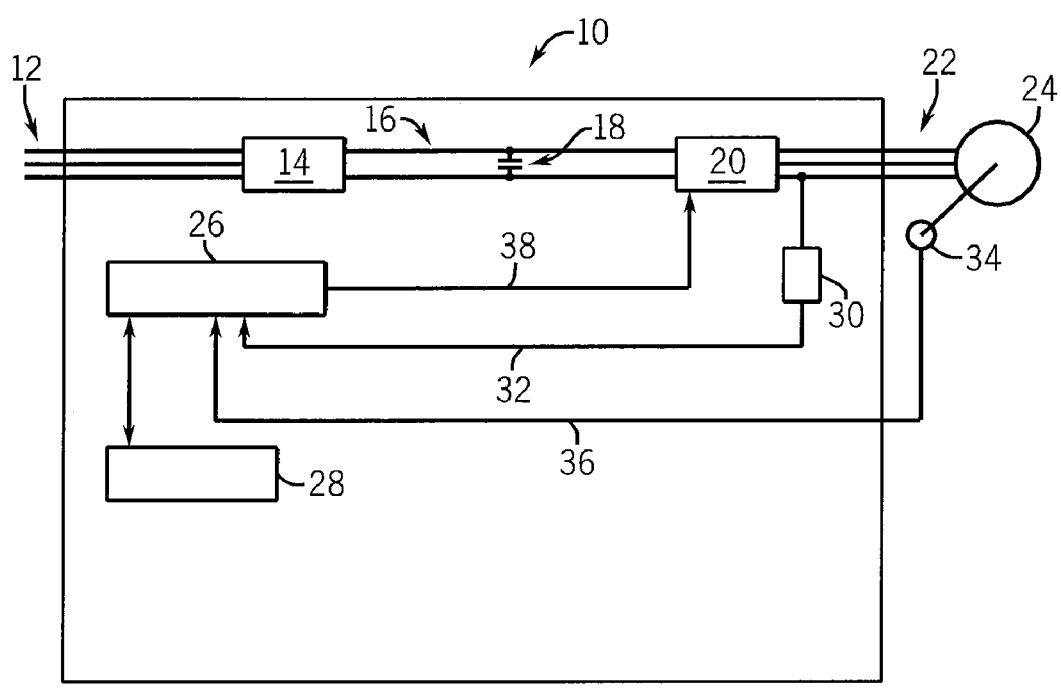
FIG. 1 is a functional block diagram of a motor and a motor drive incorporating the present invention.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION OF THE PREFERRED EMBODIMENTS

Referring now to FIG. 1, a motor drive 10 generally includes an input power source 12, such as a three-phase alternating current (AC) source. Alternately, the input power 12 could be a single-phase AC or direct current (DC) source. A preferred topology for the motor drive includes an input power source 12 connected to a rectifier section 14. The rectifier section 14 may be either active or passive, as is known in the art. The rectifier section 14 converts the input power 12 to a suitable DC voltage and supplies it to the DC bus 16. A DC bus capacitor 18 is connected between the positive and negative rails of the DC bus 16 to help maintain a substantially constant DC voltage level on the DC bus 16. The DC bus 16 is connected to an inverter section 20 which converts the DC bus voltage to an output voltage 22 suitable for use by the motor 24 connected to the motor drive 10. Alternately, any suitable topology for a motor drive 10, including but not limited to a matrix converter or a multi-level converter, may be used to convert the input power 12 to the output voltage 22 for the motor 24.

A motor control algorithm executes on a processor 26 to provide control signals 38 to the inverter section 20. The program accesses a memory device 28 to retrieve stored data, such as motor parameters, and preferably receives at least one current feedback signal 32. For example, the current feedback signal 32 may be measured from at least one current sensor 30 coupled to the output to the motor. The program further receives a rotor position signal 36 which may be provided by a position transducer 34 connected to the motor 24. Alternately, the motor drive may operate without a position transducer 34, generating the position signal 36 using a position observer. In response, at least in part, to the current 32 and position 36 signals of the motor 24 a current regulator executed by the program determines new voltage references for the motor 24. The voltage references are used to generate the control signals 38 to the inverter section 20 by using, for example, a PWM algorithm. Alternately, any method known in the art of regulating the output voltage 22 at the desired voltage references may be used.

Figure 2:
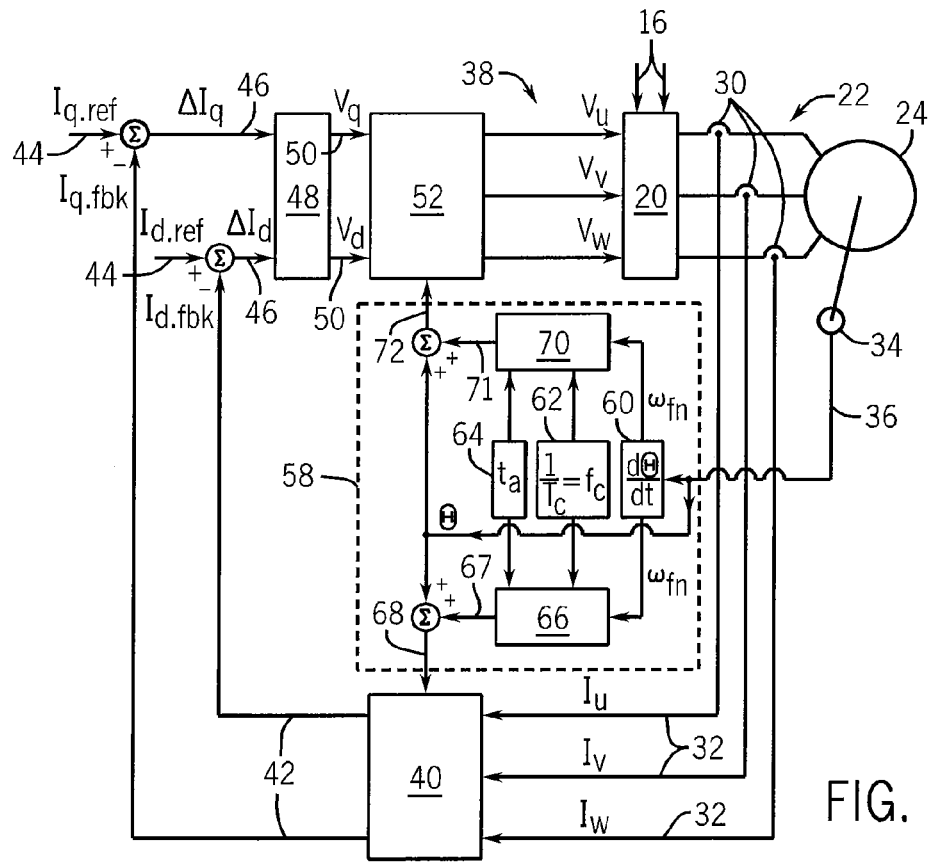
FIG. 2 is a functional block diagram of a current control system within the motor drive of FIG. 1, illustrating one embodiment of the present invention.

FIG. 2 illustrates one embodiment of a current regulator incorporating the rotor position compensation 58 of the present invention. The control portion 48 of the current regulator preferably executes on variables transformed into the synchronous reference frame. It is well known that the synchronous reference frame consists of a direct, or "d," axis and a quadrature, or "q," axis component and rotates with the voltage vector applied to the motor. An ideal transformation of the current signals 32 from the three-phase, stationary reference frame of the motor into the two-phase, synchronous reference frame converts the current signals 32 from sinusoidally varying variables into variables having a discrete magnitude, resulting in feedback signals that are well suited for control algorithms.

In FIG. 2, the rotor position 36 and motor current signals 32 are sampled periodically and used by the current regulator. Angle compensation 58 adjusts the rotor position 36 signal to provide a voltage compensation angle 71 and a current compensation angle 67. The current compensation angle 67 is added to the rotor position 36 to provide a first compensated angle 68 to a current coordinate transformation block 40. The current coordinate transformation block 40 uses the sampled current signals 32 and the first compensated angle 68 to generate a two-phase current feedback signal 42. The current feedback signal 42 is compared to a current reference signal 44 generated within the drive 10. The difference 46 between the reference 44 and the feedback 42 signals are provided as input signals to a control portion 48 of the current regulator. The control portion 48 may be a proportional, integral, and derivative (PID) controller, as is known in the art, and outputs a voltage reference 50 in a synchronous reference frame. The voltage compensation angle 71 is then added to the rotor position 36 to provide a second compensated angle 72. The second compensated angle 72 and the voltage reference 50 are used by a voltage coordinate transformation block 52 to generate the control signals 38 to the inverter section 20.

Figure 3:
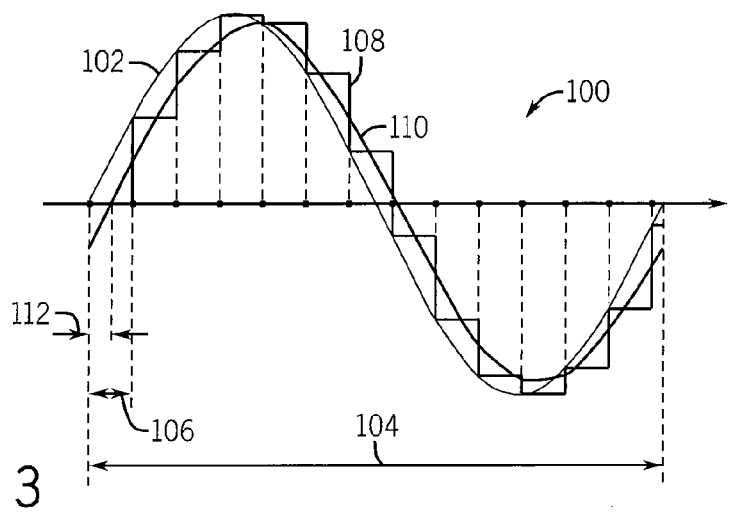
FIG. 3 is a graphical representation of the voltage reference and voltage output waveforms.
Figure 4:
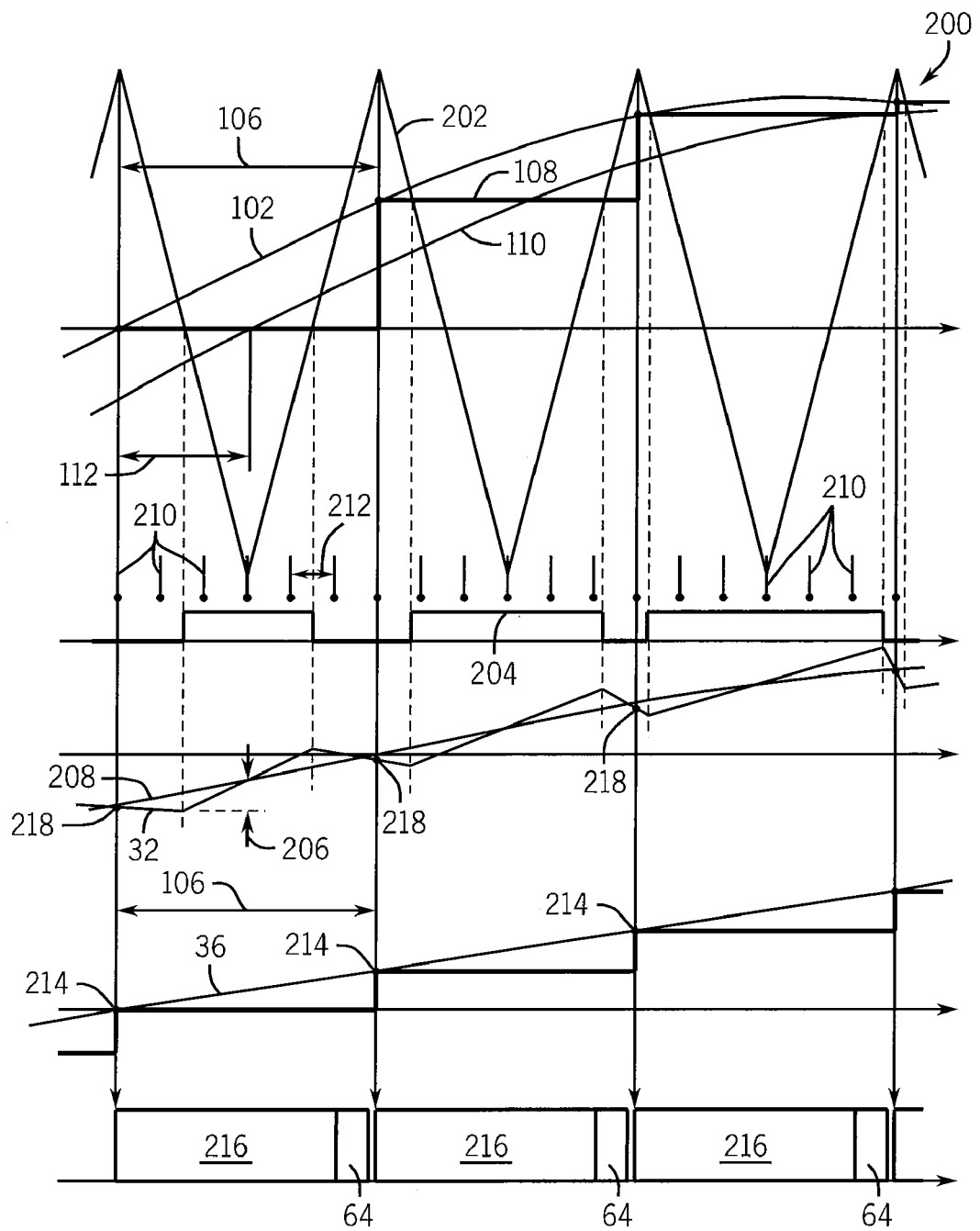
FIG. 4 is graphical representation of the timing related to the PWM algorithm.

In operation, the rotor position compensation 58 preferably provides up to three types of angle compensation to enhance stability of the current regulator. The voltage compensation angle 71 includes angle compensation for the phase lag between the output voltage 22 and the voltage reference as well as compensation for the effects of sampling the current 32 and rotor position 36 signals. The current compensation angle 67 includes angle compensation for the effects of sampling the current 32 and rotor position 36 signals. Referring to FIGS. 2-4, details of each type of angle compensation are given below.

According to FIG. 3, a timing diagram 100 illustrates the differences between the reference voltage and the output voltage as a result of a PWM algorithm. A single, sinusoidal reference voltage waveform 102 represents a single phase of the voltage reference 38 generated by the current regulator. The period 104 of the reference voltage 102 is equal to the inverse value of the desired output frequency for the voltage reference 102. A motor control algorithm executes on the processor 26 on a repetitive basis once per carrier period 106. The repetitive execution of the motor control algorithm creates an inherent phase lag between the reference voltage waveform 102 and the output voltage. During a first carrier period 106, the motor control algorithm samples input signals, for example the current 32 and position 36 signals, and determines a new value of the voltage reference 38. The new voltage reference 38 is output during the next carrier period 106.

The phase lag is further dependent on the PWM algorithm used to convert the reference voltage waveform 102 to the output voltage. The PWM algorithm causes the output voltage 22 to the motor 24 to be switched on (connecting to the voltage present on the DC bus 16) and off (zero volts DC) many times during one carrier period. An average value of the switched, PWM voltage may be determined over the carrier period 106. The resulting average output voltage is illustrated by the stepped waveform 108. However, the first harmonic component 110 of the stepped waveform represents the portion of the stepped waveform 108 output to the motor 24 producing useful work from the motor. In order to increase efficiency and improve stability of the motor drive 10, the output reference voltage 102 is preferably compensated to account for the phase lag 112 between the first harmonic component 110 of the stepped output voltage 108 and the uncompensated voltage reference 102.

In order to compensate the output reference voltage 102 for the phase lag 112 between the first harmonic component 110 and the uncompensated voltage reference 102, the relationship between the two waveforms, 110 and 102, must first be determined. A Fourier series may be used to describe a periodic, stepped waveform 108 as a summation of sinusoidal waveforms. The first harmonic component 110 of the stepped output voltage 108 may be represented by the fundamental component of a Fourier series describing the stepped waveform 108. The Fourier series may be represented by equation (1).

$$f(x) = \frac{a_0}{2} + \sum_{k=1}^{\infty} [A_k \cdot \mathrm{Sin}(k \cdot x + \gamma_k)] \qquad (1)$$

where:

$$A_k = \sqrt{a_k^2 + b_k^2} \qquad (2)$$

$$a_k = \frac{1}{2 \cdot \pi} \cdot \int_0^{2\pi} [f(x) \cdot \mathrm{Cos}(k \cdot x) \, dx] \text{ for } k = 0, 1, 2, \ldots \qquad (3)$$

-continued $$b_k = \frac{1}{2 \cdot \pi} \cdot \int_0^{2\pi} [f(x) \cdot \text{Sin}(k \cdot x) dx] \text{ for } k = 1, 2, \ldots \quad (4)$$

$\gamma_k$ is the phase shift for a particular component of the Fourier series and is found according to equation (5).

$$\gamma_k = \text{arc}tg \frac{a_k}{b_k} \quad (5)$$

Before using equation (1) to determine the fundamental component of the Fourier series, the ratio between the carrier frequency and the fundamental frequency output to the motor may be determined as shown in equation (6).

$$N = \frac{f_c}{f_{fn}} \quad (6)$$

where $f_c$ is the carrier frequency and $f_{fn}$ is the fundamental frequency.

The phase lag of the fundamental component of the Fourier series may be determined by solving equation (5) with k equal to one and by initially using an integer value of the ratio between the fundamental frequency output to the motor and the carrier frequency. Equations (3) and (4) may be solved to find $a_1$ and $b_1$.

$$a_1 = \frac{1}{\pi} \cdot \text{Sin}\frac{\Delta\varphi}{2} \cdot \sum_{i=0}^{N-1} \left\{ -\frac{1}{2} \cdot \text{Sin}\left(\frac{\Delta\varphi}{2}\right) \right\} = -\frac{1}{2 \cdot \pi} \cdot \text{Sin}^2\left(\frac{\Delta\varphi}{2}\right). \quad (7)$$

$$b_1 = \frac{1}{\pi} \cdot \text{Sin}\frac{\Delta\varphi}{2} \cdot \sum_{i=0}^{N-1} \left\{ \frac{1}{2} \cdot \text{Cos}\left(\frac{\Delta\varphi}{2}\right) \right\} = \frac{1}{2 \cdot \pi} \cdot \text{Sin}\left(\frac{\Delta\varphi}{2}\right) \cdot \text{Cos}\left(\frac{\Delta\varphi}{2}\right) \quad (8)$$

where $\Delta\varphi$ is the percentage of one period of the fundamental frequency taken up by one period of the carrier period, expressed in radians, as shown in equation (9).

$$\Delta\varphi = \frac{2 \cdot \pi \cdot f_{fn}}{f_c} \quad (9)$$

Substituting equations (7) and (8) into equation (5) results in an expression for the phase lag 112, in radians, between the first harmonic component 110 of the stepped voltage output 108 and the voltage reference 102.

$$\gamma_v = -\frac{\pi}{N} \quad (10)$$

However, the ratio between the carrier frequency and the fundamental frequency output to the motor will often not result in an integer. Therefore, an expression must be developed which provides the phase lag 112 for any ratio of carrier frequency to fundamental frequency output. Using linear interpolation, as well as equations (6) and (10), equation (11) provides an expression of the phase lag 112 for any ratio of carrier frequency to fundamental frequency output.

$$\gamma_v = -\left[\frac{\pi}{N_2} + \left(\frac{\pi}{N_1} - \frac{\pi}{N_2}\right) \cdot \left(N_2 - \frac{f_c}{f_{fn}}\right)\right] \quad (11)$$

where $N_1$ is the integer value less than the actual value of the ratio between the carrier frequency and the fundamental frequency and $N_2$ is the integer value greater than the actual value of the ratio. Thus, the voltage compensation angle 71 includes angle compensation for the phase lag between the first harmonic component 110 of the output voltage 22 and the voltage reference 102.

The voltage compensation angle 71 preferably includes additional compensation dependent on the timing of sampling the current 32 and rotor position 36 signals within a carrier period 106. Referring next to FIG. 4, at least some of the events occurring within one carrier period 106 of a sine-triangle PWM algorithm 200 used to generate the output voltage, as is known in the art, are illustrated. It is contemplated that other PWM algorithms, as would be known to one skilled in the art, may be used to generate the output voltage, such as space-vector or multi-level algorithms. In the sine-triangle algorithm 200, a triangular waveform 202 is compared to the output voltage reference 102 and used to enable and disable the PWM output voltage 204. As a result of the PWM switching, the output voltage 204 changes state multiple times during one carrier period 106. The motor current 32 is a function, at least in part, of the PWM output voltage 204. Consequently, the actual motor current 32 has some level of ripple current 206 which is dependent on the particular PWM algorithm implemented. In comparison, the first harmonic current waveform 208 is generally an average value of the actual motor current 32. Because of the ripple on the actual motor current, it may be desirable to sample the current at multiple sampling events 210 per carrier period 106 in order for the motor drive 10 to obtain a more accurate sampling of the actual motor current 32.

However, sampling the motor current 32 at multiple sampling events 210 per carrier period 106 may require an additional compensation term be added to the voltage compensation angle 71. Because both the rotor position signal 36 and the current feedback signals 32 are both used by the current regulator, if the two signals 32 and 36 are not sampled at the same point in time, additional lag will be introduced to the current regulator. The rotor position signal 36 changes predictably during a single carrier period 106 and position sampling events 214 typically occur once per carrier period 106. Consequently, if the current is sampled at multiple sampling events 210 per carrier period 106, then the resulting lag may need to be compensated to enhance stability of the current regulator. Similarly, if the motor current signal 32 is only sampled once per carrier period but it is not sampled at the same instance in time as the position signal 36, then a phase lag will similarly be introduced that may need to be compensated. The additional angle compensation 73 required is given by equation (12).

$$\varphi_v = \frac{2 \cdot \pi \cdot f_{fn}}{f_c} \cdot \frac{K}{M} \quad (12)$$

where K is the number of elementary sampling intervals 212 between sampling the rotor position signal 36 and the end of the carrier period 106 and M is the maximujm possible number of elementary sampling events 210 during each carrier period 106. Adding the additional angle compensation 73 of equation (12) to the phase lag compensation found in equation (13) results in a voltage compensation angle 71 according to equation (13).

$$\gamma_v = \frac{2 \cdot \pi \cdot f_{fn}}{f_c} \cdot \frac{K}{M} + \left[ \frac{\pi}{N_2} + \left( \frac{\pi}{N_1} - \frac{\pi}{N_2} \right) \cdot \left( N_2 - \frac{f_c}{f_{fn}} \right) \right] \quad (13)$$

Referring again to FIG. 2, the voltage compensation angle 71 is calculated at a second compensation block 70 between the rotor signal position 36 and the voltage coordinate transformation block 52. The program executing in the processor 26 determines the time required to execute the motor control algorithm, $t_a$, 64. This execution time 64 may be pre-calculated and read from the memory device 28 or, alternately, may be determined on a continuous basis as the motor drive 10 executes the motor control algorithm.

The execution time 64 is used to determine the number of elementary sampling events, M, 210 per carrier period 106. Having determined the execution time 64 of the motor control algorithm, the remaining time 216 in the carrier period 106 may be used to obtain multiple samples of the motor current signal 32. It is desirable to have a uniform sampling interval 212 between sampling events. Therefore, the maximum number of sampling events per carrier period may be found by dividing the carrier period 106 by the execution time 64. Any integer number of sampling events 210 between one and the maximum number of sampling events per carrier period may be selected.

The rotor position signal 36 is differentiated 60 to obtain the angular velocity, $\omega_{fn}$, of the motor 24 in radians per second. The angular velocity, $\omega_{fn}$, is provided as an input to the second compensation block 70. The angular velocity of the motor is equal to $2 \cdot \pi \cdot f_{fn}$ and, therefore, provides a portion of equation (13) calculated by the second compensation block 70.

The carrier frequency, $f_c$, is equal to the inverse of the carrier period 106. The carrier frequency, $f_c$, is typically user selectable on a motor drive 10 and stored within memory 28. The carrier frequency 62 is read from memory and input to the second compensation block 70.

The output of the second compensation block 70 is the voltage compensation angle 71. The voltage compensation angle 71 is added to the rotor position 36 to provide the second compensated angle 72. The second compensated angle 72 is used by the voltage coordinate transformation block 52 to generate the control signals 38 to the inverter section 20.

The current coordinate transformation block 40 may be compensated for phase lag as a result of multiple elementary sampling events per carrier period 106 in a similar manner that the voltage coordinate transformation block 52 was compensated.

$$\gamma_c = \frac{2 \cdot \pi \cdot f_{fn}}{f_c} \cdot \left[ 1 - \frac{X}{G \cdot M} - \frac{K}{M} \right] \quad (14)$$

where G equals one if there is a single current measurement during the carrier period 106 and G equals two if there are multiple current measurement during the carrier period 106. X is equal to the number of elementary sampling intervals 212 between the beginning of the carrier period 106 and the last current sampling event 218.

Referring again to FIG. 2, the current compensation angle 67 is calculated at a first compensation block 66 between the rotor signal position 36 and the current coordinate transformation block 40. The execution time 64, carrier frequency 62, and differentiated rotor position signal 60 provided as inputs to the second compensation block 70 are similarly provided as inputs to the first compensation block 66. The output of the first compensation block 66 is the current compensation angle 67, calculated according to equation (14). The current compensation angle 67 is added to the rotor position 36 to provide the first compensated angle 68. The first compensated angle 68 is used by the current coordinate transformation block 40 to generate the current feedback signals 42 compared to the current reference signals 44.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention

We claim:

1. A method of regulating current for an electric motor having a rotor and a stator using a Pulse Width Modulation (PWM) based controller comprising the steps of:

measuring at least one phase current drawn by the stator of the motor;

determining an angular position of the rotor in the motor; and adding a voltage compensation angle to the angular position wherein the voltage compensation angle is determined by a phase lag between a sinusoidal voltage reference, being generated prior to inputting into an inverter section, and a first harmonic of a discrete voltage reference output resulting from the sinusoidal voltage reference.

2. The method of regulating current of claim 1 further comprising the steps of:

determining a voltage reference signal in a two-phase reference system using the phase current and the angular position; and performing a reference frame transformation on the voltage reference signal using the compensated angular position.

3. The method of regulating current of claim 2 further comprising the step of calculating a current compensation angle which is a function of the number of times and of the position in time during each PWM period that the phase current and the angular position are sampled, wherein the current compensation angle is calculated after determining an angular position of the rotor and before determining a voltage reference signal, and the voltage reference signal is determined using the phase current and the angular position compensated by the current compensation angle.

4. The method of regulating current of claim 3 wherein the current compensation angle is determined according to the following equation:

$$\gamma_c = \frac{2 \cdot \pi \cdot f_{fn}}{f_c} \cdot \left[1 - \frac{X}{G \cdot M} - \frac{K}{M}\right]$$

where: $\gamma_c$=current compensation angle
- $f_c$=carrier frequency
- $f_{fn}$=fundamental frequency
- K=number of sampling intervals between sampling the rotor position signal and the end of the carrier period
- M=maximum number of sampling events during each carrier period
- X=number of elementary sampling intervals between the beginning of the carrier period and the last current sampling event
- G=1 if there is a single current measurement during the carrier period
- G=2 if there are multiple current measurements during the carrier period.

5. The method of regulating current of claim 1 wherein the voltage compensation angle is calculated by:
   finding a ratio of a carrier frequency of the PWM controller to a fundamental frequency of the motor;
   finding a first integer value less than the ratio and a second integer value greater than the ratio; and
   interpolating a value for the voltage compensation angle between pi divided by the first integer value and π divided by the second integer value as a function of the ratio of the carrier frequency to the fundamental frequency.

6. The method of regulating current of claim 5 wherein the voltage compensation angle is determined according to the following equation:

$$\gamma_v = -\left[\frac{\pi}{N_2} + \left(\frac{\pi}{N_1} - \frac{\pi}{N_2}\right) \cdot \left(N_2 - \frac{f_c}{f_{fn}}\right)\right]$$

where: $\gamma_v$=voltage compensation angle
- $N_1$=ratio between $f_c$ and $f_{fn}$ rounded down to the next lower integral value
- $N_2$=ratio between $f_c$ and $f_{fn}$ rounded up to the next higher integral value
- $f_c$=carrier frequency
- $f_{fn}$=fundamental frequency.

7. The method of regulating current of claim 1 wherein the voltage compensation angle further adds an offset angle which is a function of the number of times the current is sampled during each PWM period.

8. The method of regulating current of claim 7 wherein the voltage compensation angle is determined according to the following equation:

$$\gamma_v = \frac{2 \cdot \pi \cdot f_{fn}}{f_c} \cdot \frac{K}{M} + \left[\frac{\pi}{N_2} + \left(\frac{\pi}{N_1} - \frac{\pi}{N_2}\right) \cdot \left(N_2 - \frac{f_c}{f_{fn}}\right)\right]$$

where: $\gamma_v$=voltage compensation angle
- $N_1$=ratio between $f_c$ and $f_{fn}$ rounded down to the next lower integral value
- $N_2$=ratio between $f_c$ and $f_{fn}$ rounded up to the next higher integral value
- $f_c$=carrier frequency
- $f_{fn}$=fundamental frequency
- K=number of sampling intervals between sampling the rotor position signal and the end of the carrier period
- M=maximum number of sampling events during each carrier period.

9. The method of regulating current of claim 1 wherein the angular position of the motor is determined using a position transducer.

10. The method of regulating current of claim 1 wherein the angular position of the motor is determined using a position observer.

11. The method of regulating current of claim 1 wherein the carrier frequency for the PWM controller is at most 20 times greater than a fundamental electrical frequency of the motor.

12. A method of regulating current for an electric motor having a rotor and a stator using a Pulse Width Modulation (PWM) based controller comprising the steps of:
   measuring at least one phase current drawn by the stator of the motor;
   determining an angular position of the rotor in the motor;
   calculating a current compensation angle which is a function of the number of times and of the position in time during each PWM period that the phase current and the angular position are sampled,
   determining a voltage reference signal in a two-phase reference system using the phase current and the current compensation angle added to the angular position;
   adding a voltage compensation angle to the angular position wherein the voltage compensation angle adds a phase lag between a sinusoidal voltage reference, being generated prior to inputting into an inverter section, and a first harmonic of a discrete voltage reference output resulting from the sinusoidal voltage reference and an offset angle which is a function of the number of times the current is sampled during each PWM period;
   performing a reference frame transformation on the voltage reference signal using the compensated angular position; and
   generating an output voltage to the motor using the transformed voltage reference signal as an input to a PWM algorithm in the controller.

13. The method of regulating current of claim 12 wherein the voltage compensation angle is determined according to the following equation:

$$\gamma_v = \frac{2 \cdot \pi \cdot f_{fn}}{f_c} \cdot \frac{K}{M} + \left[\frac{\pi}{N_2} + \left(\frac{\pi}{N_1} - \frac{\pi}{N_2}\right) \cdot \left(N_2 - \frac{f_c}{f_{fn}}\right)\right]$$

where: $\gamma_v$=voltage compensation angle
- $N_1$=ratio between $f_c$ and $f_{fn}$ rounded down to the next lower integral value
- $N_2$=ratio between $f_c$ and $f_{fn}$ rounded up to the next higher integral value
- $f_c$=carrier frequency
- $f_{fn}$=fundamental frequency
- K=number of sampling intervals between sampling the rotor position signal and the end of the carrier period
- M=maximum number of sampling events during each carrier period.

14. The method of regulating current of claim 12 wherein the current compensation angle is determined according to the following equation:

$$\gamma_c = \frac{2 \cdot \pi \cdot f_{fn}}{f_c} \cdot \left[1 - \frac{X}{G \cdot M} - \frac{K}{M}\right]$$

where: $\gamma_c$=current compensation angle
$f_c$=carrier frequency
$f_{fn}$=fundamental frequency
K=number of sampling intervals between sampling the rotor position signal and the end of the carrier period
M=maximum number of sampling events during each carrier period
X=number of elementary sampling intervals between the beginning of the carrier period and the last current sampling event
G=1 if there is a single current measurement during the carrier period
G=2 if there are multiple current measurements during the carrier period.

15. The method of regulating current of claim 12 wherein the angular position of the motor is determined using a position transducer.

16. The method of regulating current of claim 12 wherein the angular position of the motor is determined using a position observer.

17. A PWM based motor drive configured to operate at a carrier frequency, the PWM based motor drive comprising:
   a power conversion section to convert an input voltage to an output voltage for a motor;
   at least one current sensor providing a current signal corresponding to a current output to the motor;
   a position sensing means providing a position signal corresponding to an angular position of a rotor of the motor;
   a memory device in which a program configured to control the motor is stored; and
   a processor receiving each of the current and position signals and executing the program stored in the memory device, the program configured to execute to:
      read the current signal at least once during each carrier period;
      read the position signal once during each carrier period;
      determine a current compensation angle which is a function of the number of times and of the relative time during each carrier period that the current signal and the position signal are read;
      determine a voltage reference signal in a two-phase reference system using the current signal and the current compensation angle added to the position signal;
      determine a voltage compensation angle as a function of a phase lag between a sinusoidal voltage reference, being generated prior to inputting into an interver section, and a first harmonic of a discrete voltage reference output and an offset angle which, in turn, is a function of the number of times the current is sampled during each carrier period;
      determine a compensated angular position by adding the voltage compensation angle to the position signal;
      transform the voltage reference signal between reference frames using the compensated angular position; and
   provide the transformed voltage reference signal to the power conversion section as the reference for the output voltage.

18. The PWM based motor drive of claim 17 wherein the position sensing means is a position transducer.

19. The PWM based motor drive of claim 17 wherein the position sensing means is a position observer.

20. The PWM based motor drive of claim 17 wherein the carrier frequency for the PWM controller is at most 20 times greater than a fundamental electrical frequency of the motor.

* * * * *